(12) United States Patent
Fukuda et al.

(10) Patent No.: US 7,508,269 B2
(45) Date of Patent: Mar. 24, 2009

(54) STABILIZATION CIRCUIT AND MULTIBAND AMPLIFICATION CIRCUIT

(75) Inventors: Atsushi Fukuda, Yokohama (JP); Hiroshi Okazaki, Yokosuka (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 75 days.

(21) Appl. No.: 11/561,616

(22) Filed: Nov. 20, 2006

(65) Prior Publication Data
US 2007/0115065 A1 May 24, 2007

(30) Foreign Application Priority Data
Nov. 24, 2005 (JP) ............... 2005-338489

(51) Int. Cl.
*H03F 3/04* (2006.01)
(52) U.S. Cl. ..................................... 330/302
(58) Field of Classification Search .......... 330/302–306
See application file for complete search history.

(56) References Cited

U.S. PATENT DOCUMENTS 5,202,649 A * 4/1993 Kashiwa .................. 333/33
6,232,847 B1 5/2001 Marcy, V et al.
2002/0149535 A1 10/2002 Toncich
2005/0245209 A1 * 11/2005 Schlesinger ............... 455/102
2006/0261911 A1 11/2006 Fukuda et al.

FOREIGN PATENT DOCUMENTS

| EP | 1 422 823 A2 | 5/2004 |
|---|---|---|
| JP | 61-264907 | 11/1986 |
| JP | 2006-325153 | 11/2006 |
| WO | WO 02/084686 A1 | 10/2002 |
| WO | WO 03/105174 A1 | 12/2003 |
| WO | WO 2004/082138 A1 | 9/2004 |

OTHER PUBLICATIONS

Koji Chiba, et al., "Mobile Terminals", New Technology Report, pp. 14-19 (With English Translation).
Atsushi Fukuda, et al., "Multi-band Power Amplifier Employing MEMS Switches for Optimum Matching", (C-2-4), 2004, p. 39 (With English Translation).

* cited by examiner

*Primary Examiner*—Robert Pascal
*Assistant Examiner*—Khiem D Nguyen
(74) *Attorney, Agent, or Firm*—Oblon, Spivak, McClelland, Maier & Neustadt, P.C.

(57) ABSTRACT

A stabilization circuit which includes serial stabilization blocks connected in series, with respect to a signal to be amplified, with an amplification element; parallel stabilization blocks connected in parallel with the amplification element, with respect to a signal to be amplified; and a switch part capable of connecting and disconnecting said parallel stabilization block, with respect to a signal to be amplified.

10 Claims, 10 Drawing Sheets

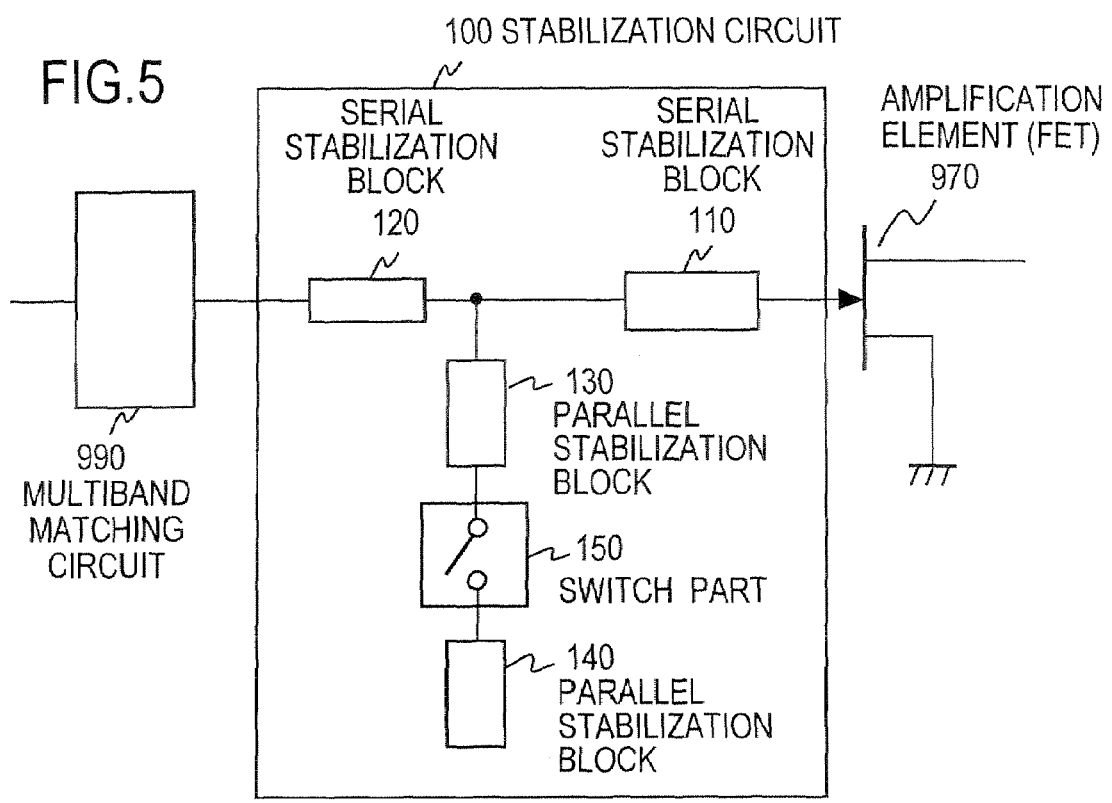
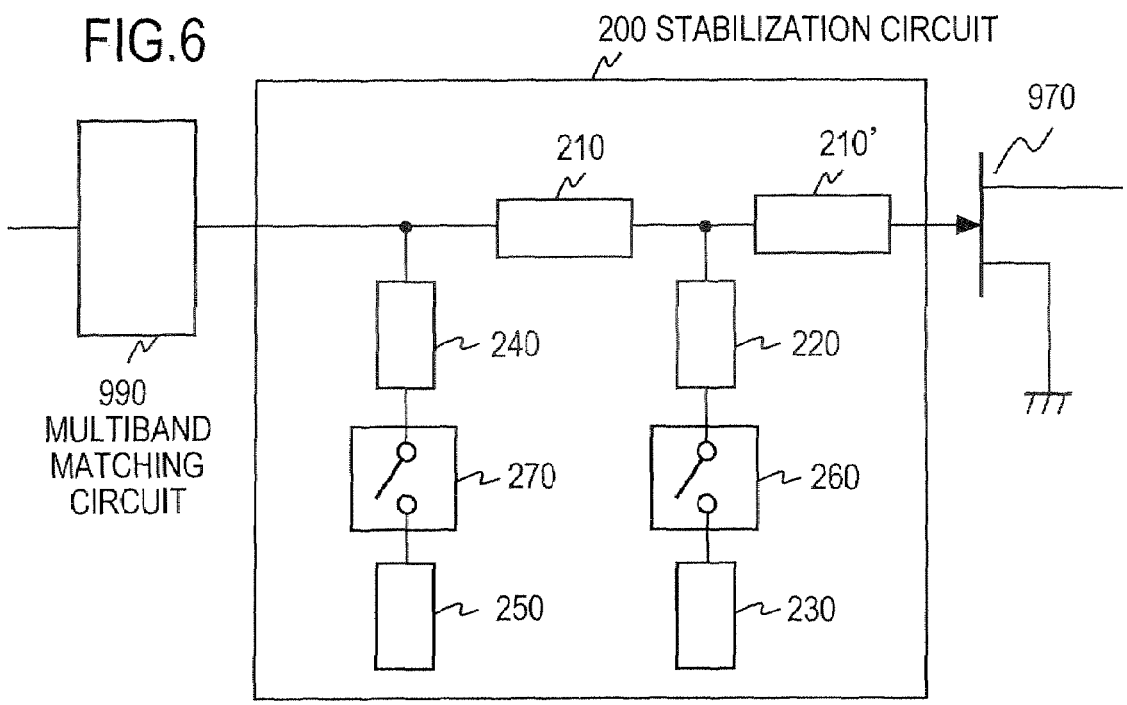

STABILIZATION CIRCUIT AND MULTIBAND AMPLIFICATION CIRCUIT

TECHNICAL FIELD

This invention pertains to a stabilization circuit bringing an amplification element to stable operation and a multiband amplification circuit using a stabilization circuit.

BACKGROUND ART

Accompanying the diversification in services provided by means of radio communications, a capability for multiband operations whereby information is processed in a plurality of frequency bands is in demand of radio equipment. As an indispensable device included in a piece of radio equipment, there is the power amplifier. In order to carry out highly efficient amplification, there is a need to obtain impedance matching between the amplification element which actually amplifies the signal and the peripheral circuits thereof. For this use, a matching circuit is used. Further, the input/output impedance of a peripheral circuit is generally made to coincide at a certain fixed value $Z_0$ (being e.g. 50Ω, 75Ω, or the like), and hereinafter, the input/output impedance of the peripheral circuit is chosen to be called "the system impedance".

In FIG. 1, there is shown an example of the input and output scattering parameters (S-parameters) of an amplification element used in an amplifier. In this example, S11 is the input reflection coefficient of the amplification element in the case where the output load is 50Ω and S22 is the output reflection coefficient of the amplification element in the case where the input load is 50Ω. Also, by using these reflection coefficients and a Smith chart, it is possible to obtain the input/output impedance of the amplification element. The input/output impedance of the amplification element has, frequency-dependent characteristics, as shown with bold solid lines in FIG. 1. The values of the input/output impedance can be obtained from the S-parameters and the system impedance $Z_0$. Consequently, in case an amplifier is designed using an amplification element like the one above, impedance matching between the input/output impedance of the amplification element and the system impedance $Z_0$ at the design frequency is necessary. In other words, in the case of designing a multiband amplification circuit, impedance matching between the input/output impedance of the amplification element and the system impedance $Z_0$ becomes necessary at a plurality of design frequencies.

Accordingly, in the case of amplifying signals in different frequency bands, there are, as in the amplifier used inside the band-sharing mobile terminal described in Reference 1 (Kouji Chiba et al., "Mobile Terminals", NTT DoCoMo Technical Journal, Vol. 10, No. 1, pp. 15-20), (1) the method of providing amplifiers combining an amplification element and a matching circuit, wherein the number of the amplifiers equals to the number of frequency bands, and selecting an amplifier in response to the used frequency band, and (2) the method of providing one amplification element, which has an amplifiable frequency domain which is sufficiently wide with respect to the operating frequency band of the matching circuit, and a matching circuit capable of modifying each parameters of the circuit elements in response to the frequency band in which an amplifier operates. In particular, method (2) has the advantage that a reduction in the size of the amplifier is possible in comparison with method (1).

In FIG. 2, there is shown an example of a multiband matching circuit having small losses, shown in Reference 2 (A. Fukuda, H. Okazaki, T. Hirota, and Y. Yamao, "Multi-band Power Amplifier Employing MEMS Switches for Optimum Matching", C-2-4, 2004). A multiband matching circuit 900 comprises a main matching block 910, a delay circuit 920 connected at one end thereof to main matching block 910, an auxiliary matching block 930, and a switch element 940 connected between the other end of delay circuit 920 and one end of auxiliary matching block 930. In the case where a load 1020 having impedance frequency characteristics $Z_L(f)$ connects to a port 952, multiband matching circuit 900 is a matching circuit which matches impedances between the impedance, seen from a port 951 toward the side of multiband matching circuit 900, and the impedance $Z_0$ of a load 1010 in the signal band. E.g., it is possible, as shown in FIG. 3, to match the impedances in two frequency bands; one has center frequency $f_1$, and the other has center frequency $f_2$.

First, an explanation will be given regarding impedance matching at frequency $f_1$. In this case, switch element 940 is chosen to be in the OFF state. A signal input from e.g. the side of port 952 passes through main matching block 910 and delay circuit 920, and is transmitted to the side of port 951. Here, main matching block 910 can be composed of one or more arbitrary circuitry and is chosen to be the circuit which matches between impedance $Z_L(f_1)$ and impedance $Z_0$ at frequency $f_1$. Also, delay circuit 920 is chosen to be the transmission line having a characteristic impedance $Z_0$. Consequently, the value of the impedance seen from a connection point 953, shown in FIG. 2, between main matching block 910 and delay circuit 920, toward the side of port 951 is $Z_0$. In other words, multiband matching circuit 900 implements impedance matching with itself at frequency $f_1$.

Next, assuming the aforementioned design of impedance matching at frequency $f_1$, an explanation will be given regarding impedance matching at frequency $f_2$. In this case, switch element 940 is chosen to be in the ON state. Main matching block 910 operates as an impedance converter at frequency $f_2$. So, the value of the impedance seen from connection point 953 toward the side of port 952 is $Z_L'(f_2)$, which is the result that the impedance was converted into by main matching block 910.

Without regard for the value of $Z_L'(f_2)$, by appropriately setting the line length of delay circuit 920 which is a transmission line and the reactance value of auxiliary matching block 930 connected in parallel with delay circuit 920 as design items in advance, it is possible, on the basis of the single stub matching scheme, to convert the value of the impedance seen from port 951 toward the side of multiband matching circuit 900 to the value $Z_0$. In short, multiband matching circuit 900 can obtain impedance matching with itself at frequency $f_2$ as well.

By adding delay circuit 920 having a characteristic impedance $Z_0$ and auxiliary matching block 930 connected to main matching block 910 via switch element 940, multiband matching circuit 900 can operate as a matching circuit both at frequency $f_1$, and frequency $f_2$. In short, multiband matching circuit 900 functions as a matching circuit for two frequency bands by switching the ON/OFF state of one switch element.

In recent years, there have been developed some kind of amplification elements, e.g. transistors, which have a high gain over a large bandwidth. Generally, the gain of an amplification elements increases as the frequency becomes lower and decreases as the frequency becomes higher. E.g., microwave band transistors and the like, capable of amplification in frequency bands as high as several gigahertz have an exceedingly high amplification gain in low frequency bands at or below several tens of megahertz.

Commonly, some kind of feedback loop is formed in the periphery of the amplification element. In this case, if the gain of the same feedback loop exceeds 1, an oscillating condition is satisfied. So there is a possibility that parasitic oscillations occur. In order to prevent parasitic oscillations, no matter which load is connected to the amplification element, it is important that, across the entire frequency band, oscillating condition is not satisfied (i.e., that stable condition is satisfied). Accordingly, stabilization circuits are used in amplifiers.

A stabilization circuit is normally designed so that no influence is exerted in high frequency bands in which amplification is carried out and so that the gain of the feedback loop is lowered at low frequency bands in which parasitic oscillations occur easily. And then, the stabilization circuit is connected to both the input and output terminals of an amplification element, or in series on one side of, or in parallel with, the amplification element. By means of a stabilization circuit connected close to an amplification element, the amplification element operates stably. Consequently, by means of the stabilization circuit, the amplifier can obtain a necessary gain in the high frequency bands in which amplification is carried out and the parasitic oscillations do not occur in the low frequency bands.

In FIG. 4, there is shown an example of a conventional stabilization circuit. Stabilization circuit 960 comprises a resistor 961 and a capacitor 962 connected in parallel with the resistor 961. Stabilization circuit 960 is connected to an amplification element 970 exemplified by a transistor, a FET (Field Effect Transistor), a MOSFET (Metal Oxide Semiconductor Field Effect Transistor), a TFT (Thin Film Transistor), or the like, after appropriately setting, as design items, the design values of the resistor 961 and the capacitor 962. For circuit comprising amplification element 970 and stabilization circuit 960, oscillation condition is not satisfied in any part of the frequency band. In other words, this circuit is a stabilized circuit. Hereinafter, this circuit is also called "a stabilized amplification element".

SUMMARY OF THE INVENTION

The stabilization circuit of the present invention comprises one or several serial stabilization blocks connected in series with an amplification element, with respect to a signal to be amplified; one or several parallel stabilization blocks connected in parallel with the amplification element, with respect to a signal to be amplified; and one or several switch parts capable of connecting and disconnecting at least one of the aforementioned parallel stabilization blocks with respect to a signal to be amplified. Also, the multiband amplification circuit of the present invention is provided with an amplification element, the aforementioned stabilization circuit, and a multiband matching circuit connecting to one side, which is opposite to the side which the amplification element is connected, of the aforementioned stabilization circuit and the multiband matching circuit is capable of impedance matching in two or more frequency bands.

BRIEF EXPLANATION OF THE DRAWINGS

FIG. 5 is a circuit diagram showing a configuration example of a stabilization circuit adaptable for multiband operations.

FIG. 6 is a circuit diagram showing a variation of a stabilization circuit adaptable for multiband operations.

DETAILED DESCRIPTION OF THE INVENTION

Figure 1:
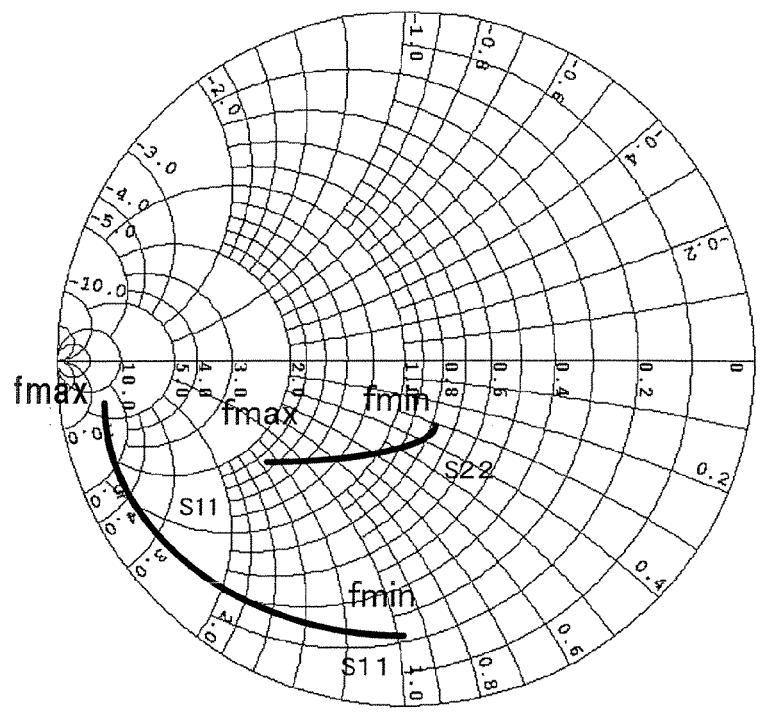
FIG. 1 is a diagram showing an example of input and output scattering parameters (S-parameters) of an amplification element used in an amplifier.

Hereinafter, embodiments of this invention will be explained. Further, constituent elements having same functions have the same reference numerals attached, and duplicate explanations thereof will be omitted.

First Embodiment

In FIG. 5, there is shown a configuration example of a stabilization circuit of the present invention adaptable for multiband operations. In this embodiment, in order to facilitate an understanding of the essentials of the present invention, an explanation will be given taking the case of a capability for dual-band operations. A stabilization circuit 100 of Embodiment 1 comprises serial stabilization block 110, serial stabilization block 120, parallel stabilization block 130, parallel stabilization block 140 and a switch part 150. A stabilization block, being a constituent element of the stabilization circuit, is made up of a distributed-parameter line, a lumped element, or a combination of these, or a plurality of distributed-parameter lines, a plurality of lumped elements, or a combination thereof, which are exemplifications used for the stabilization of an amplification element. Here, the several exemplifications of aforementioned elements are linear elements such as resistor, capacitors and coils, and non-linear two-terminal elements such as diodes, without any significant limitation. Serial stabilization block 110 and serial stabilization block 120 are connected in series with amplification element 970, with respect to a signal to be amplified, i.e. with respect to the signal path. Amplification element 970 can be exemplified by a transistor, a FET, a MOSFET, a TFT, or the like. In each circuit diagram, amplification element 970 is illustrated as an n-channel junction-type FET, but the intended meaning is not to make a limitation to n-channel junction-type FETs. The illustrated FET is only exemplification of the amplification element. Parallel stabilization block 130 and parallel stabilization block 140 are connected in parallel with amplification element 970, with respect to a signal to be amplified, i.e. with respect to the signal path. One terminal of parallel stabilization block 130 is connected between serial stabilization block 110 and serial stabilization block 120. As for switch part 150, as shown in FIG. 5, one end of switch part 150 is connected to parallel stabilization block 130, and the other end of switch part 150 is connected to parallel stabilization block 140. Switch part 150 chooses between a state in which parallel stabilization block 130 and parallel stabilization block 140 are connected (ON state) and a state in which parallel stabilization block 130 and parallel stabilization block 140 are not connected (OFF state). Also, speaking of switch parts in the present specification, without limitation to switch part 150, it is also possible to choose so-called switching elements using e.g. diodes, transistors, MOS elements, or the like, and which have a function of opening and closing the circuit without providing contact points in the network. As an exemplification, MEMS (Micro Electro Mechanical System) switches, switching diodes, and the like can be cited. Further, there are cases where, according to the design objectives, the serial stabilization block can be omitted. In the example of the embodiment shown in FIG. 5, it is possible to choose not to provide either of serial stabilization blocks 110 and 120.

As for stabilization circuit 100, switch part 150 is chosen to be in the OFF state for the first frequency $f_1$. The circuit consisting of serial stabilization blocks 110 and 120 and parallel stabilization block 130 is designed so that the stability of amplification element 970 is ensured, and so that the input impedance of the stabilized amplification element based on stabilization circuit 100 lets designers make it possible to design multiband matching circuit 990 to e.g. have a small size at frequency $f_1$. The design in this case is a design only for the case where the operating frequency is $f_1$, so a conventional design method would be acceptable. In case there are several candidates of the circuit design of serial stabilization blocks 110 and 120 and parallel stabilization block 130, these candidates are significant of the latitude during design for frequency $f_2$ to be subsequently described.

As for stabilization circuit 100, switch part 150 chooses the ON state for the second frequency $f_2$. The circuit consisting of serial stabilization blocks 110 and 120 and parallel stabilization blocks 130 and 140 is designed so that the stability of amplification element 970 is ensured, and so that the input impedance of the stabilized amplification element based on stabilization circuit 100 lets designers make it possible to design multiband matching circuit 990 to e.g. have a small size at frequency $f_2$. As for the design in this case, the design items of a suitable parallel stabilization block 140 may be added to any of the aforementioned design candidates at frequency $f_1$.

Further, designing the multiband matching circuit to become small means being able to reduce the design values (shorten the lengths) of the constituent parts which are difficult to make smaller with keeping well performance of the multiband amplifier. The aforementioned constituent parts, which are difficult to make smaller, represents constituent parts which cannot be replaced with lumped-parameter elements, for example, a transmission line connected in series.

As mentioned above, stabilization circuit 100 can, while ensuring the stability of amplification element 970 across a wide range of frequencies, set the input impedance within two frequency ranges. Due to the point that multiband matching circuit 990 can be designed to obtain matching between the input impedance, of the stabilized amplification element, set for a plurality of frequency bands (two in Embodiment 1) and the system impedance, latitude in the design of multiband matching circuit 990 is increased. Further, in the explanation given here, since an example is set forth in which the stabilization circuit is arranged on the input side of the amplification element, the expression "the input impedance of the stabilized amplification element" is used. In the case of arranging the stabilization circuit on the output side of the amplification element, attention must be paid to the fact that "the output impedance of the stabilized amplification element" should be stated.

Figure 2:
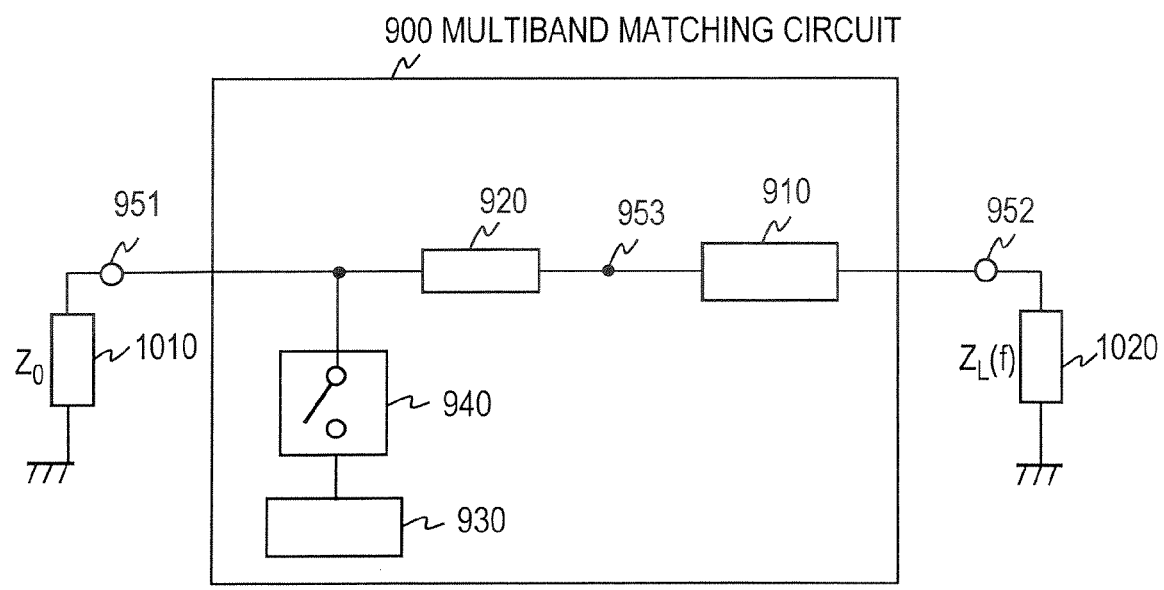
FIG. 2 is a circuit diagram showing an example of a conventional low-loss multiband matching circuit.
Figure 3:
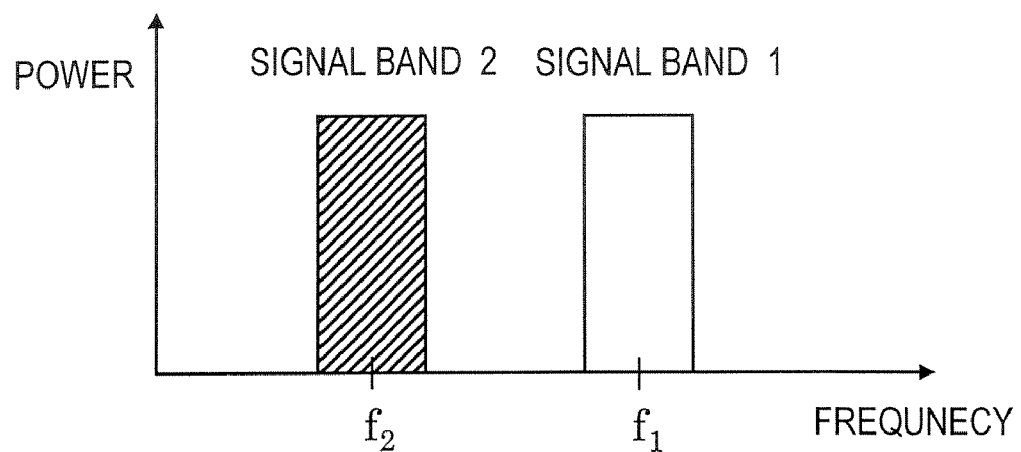
FIG. 3 is a diagram showing the image of two frequency bands.
Figure 4:
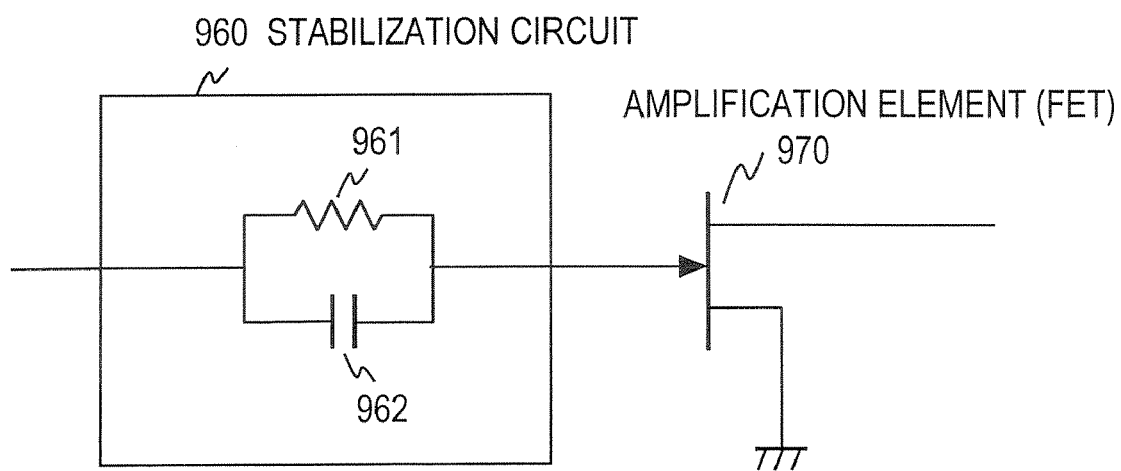
FIG. 4 is a circuit diagram showing an example of a conventional stabilization circuit.

A detail explanation concerning the explanation above will be given as follows. Stabilization circuit 100 will tentatively be assumed not to comprise switch part 150 and parallel stabilization block 140. Since a stabilization circuit like this is a conventional stabilization circuit, it is conveniently called a "conventional stabilization circuit". The input impedance of the previously explained amplification element 970 has frequency-dependent characteristics, so the input impedance of the conventional stabilization circuit connected to amplification element 970 also varies with frequency. If there is adopted an example of a multiband amplifier having a capability for dual-band operations, dual-band matching circuits (refer e.g. to FIG. 2) are connected to the conventional stabilization circuit. The value of input impedance, seen from the point of connection between this dual-band matching circuit and the conventional stabilization circuit toward the side of the conventional stabilization circuit, of the stabilized amplification element based on the conventional stabilization circuit is $Z(f_1)$ with respect to frequency $f_1$ and $Z(f_2)$ with respect to frequency $f_2$. Consequently, the dual-band matching circuit is designed to have a function whereby the impedance $Z(f_1)$ of the stabilized amplification element matches the system impedance and the input impedance $Z(f_2)$ of the stabilized amplification element matches the system impedance. At this point, with the conventional design method, it is possible to design, regarding $f_1$, the dual-band matching circuit optimally or corresponding to the optimum. Assuming a design for frequency $f_1$, the dual-band matching circuit must be designed to have a matching function for frequency $f_2$ as well. In other words, the input impedance of the stabilized amplification element based on the conventional stabilization circuit for frequency $f_2$ is uniquely $Z(f_2)$, the dual-band matching circuit is designed so that the input impedance $Z(f_2)$ of the stabilized amplification element matches the system impedance. Since the objects of matching are fixed in the input impedance $Z(f_2)$ of the stabilized amplification element and the system impedance, from the viewpoint of designing the dual-band matching circuit to as small a size as possible while assuming the design for frequency $f_1$, it is normal that the latitude of design of the dual-band matching circuit with respect to frequency $f_2$ is restricted. Assuming the design for frequency $f_1$, although dual-band matching circuits could be designed to have a small size in the case where the value of the impedance of the stabilized amplification element based on the conventional stabilization circuit at frequency $f_2$ is $Za(f_2)$, the latitude in the design of the dual-band matching circuit became restricted because of the fact that the value of the input impedance of the stabilized amplification element based on the conventional stabilization circuit for frequency $f_2$ is uniquely $Z(f_2)$. The aforementioned reason applies to the design of multiband matching circuit adaptable for three or more bands. If the number of frequency bands increases, the design conditions are limited more rigorously.

Meantime, according to the stabilization circuit of the present invention, the stabilization circuit itself is adaptable for multiband operations, so the impedance of the stabilization circuit can be set suitably depending on the frequency. To make a description with the aforementioned example, the stabilization circuit of the present invention comprises switch part 150 and parallel stabilization block 140. In case switch part 150 is chosen to be in the ON state, the design values of parallel stabilization block 140 may be set so that the value of the input impedance of the stabilized amplification element based on the stabilization circuit at frequency $f_2$ can be $Za(f_2)$.

In the case of using a conventional stabilization circuit, it was not possible to set the input impedance of the stabilized amplification element to $Za(f_2)$ for the latitude in the design of multiband matching circuit. But since it is possible to set the input impedance of the stabilized amplification element to $Za(f_2)$ according to the stabilization circuit of the present invention, the latitude in the design of multiband matching circuit is increased. Also, it is possible to design a multiband matching circuit to a smaller size, since the value of the input impedance of the stabilized amplification element based on the stabilization circuit at frequency $f_2$ becomes $Za(f_2)$. The fundamental characteristic of the stabilization circuit of the present invention resides in the point that an increase in the latitude in the design of the multiband matching circuit is obtained while the circuit functions as one which ensures the stability of the amplification element in the same way as the conventional stabilization circuit, and as a secondary characteristic, it resides in the point that it is possible to freely design the stabilization circuit so that, in proportion to increasing of the latitude in the design of the multiband matching circuit, it can have the impedance of a stabilization circuit making it possible to design the multiband matching circuit to have a small size.

As will become clear from the post-scripted embodiment/experimental example, the specific configuration and the design values of each constituent part, of the stabilization circuit of the present invention, are decided from the correlation with the multiband matching circuit and, e.g. in the case of a multiband amplifier, from the correlation with the design items thereof. In other words, the configuration of the stabilization circuit and the design values of each constituent part are determined by the characteristics of the amplifier under consideration, a power amplifier, a low-noise amplifier, e.t.c, or by the frequency characteristics of the amplification element. Meantime, the matching circuit is designed to match impedances between the input/output impedance of the stabilized amplification element and the system impedance. Accordingly, there are cases where it is difficult to configure the matching circuit with small-sized elements only depending on the input/output impedance of the stabilized amplification element. In that case, the matching circuit is increased in size, so the amplifier as a whole is also increased in size. In particular, in the case of a multiband matching circuit, with respect to all of a plurality of frequencies, there is a need to obtain impedance matching respectively. Consequently, even if it is possible to make a design so that the multiband matching circuit can become small in size at a certain frequency, it is not necessarily true that a design can be made so that the multiband matching circuit can become small in size at other frequencies. In a case like that, the multiband matching circuit becomes large-sized in the end. E.g., in multiband matching circuit 900 shown in FIG. 2, there are cases where it is necessary to design the delay circuit 920 having high delay quantity in order to obtain sufficient amplification gain at frequency $f_2$ as well. In this case, the line length of delay circuit 920, which is the transmission line, must be ensured to be long, so an increase in the size of the circuit is brought about. Moreover, in the case of considering an adaptation to two or more bands, the problem of enlargement of the installation surface becomes noticeable by the same reason. As for the stabilization circuit of the present invention, since the stabilization circuit itself is adaptable for multiband operations and is capable of suitably setting the impedance of the stabilization circuit in response to the frequency, it is possible to design the multiband matching circuit to have a small size, having the effect of bringing the above-mentioned problem under control.

Variation of the First Embodiment

In FIG. 6, a variation of the configuration of the stabilization circuit shown in Embodiment 1 is shown. A stabilization circuit 200 consists of two serial stabilization blocks 210 and 210', four parallel stabilization blocks 220, 230, 240, and 250, and two switch parts 260 and 270. Serial stabilization blocks 210 and 210' are connected in series with amplification element 970, with respect to a signal to be amplified, i.e. with respect to the signal path. One terminal of parallel stabilization block 220 is connected to one end of serial stabilization block 210. The other terminal of parallel stabilization block 220 is connected, via switch part 260, to parallel stabilization block 230. One terminal of parallel stabilization block 240 is connected to the other end of serial stabilization block 210 (the side to which parallel stabilization block 220 is not connected). The other terminal of parallel stabilization block 240 is connected, via switch part 270, to parallel stabilization block 250.

Stabilization circuit 200 has switch parts 260 and 270 that are put in the OFF state for first frequency $f_1$. The circuit constituted by serial stabilization blocks 210 and 210' and parallel stabilization blocks 220 and 240 is designed so that the stability of amplification element 970 is ensured and so that the input impedance of the stabilized amplification element based on stabilization circuit 200 lets designers make it possible to design multiband matching circuit 990 to e.g. have a small size at frequency $f_2$. The design in this case is a design only for the case where the operating frequency is $f_1$, so a conventional design method would be acceptable. In the case there several candidates of the circuit configuration with serial stabilization blocks 210 and 210' and parallel stabilization blocks 220 and 240, these candidates are significant of the latitude during design for frequency $f_2$ to be subsequently described.

For the second frequency $f_2$, stabilization circuit 200 has switch elements 260 and 270 put in the ON state. The circuit comprising serial stabilization blocks 210 and 210' and parallel stabilization blocks 220, 230, 240, and 250 is designed so that the stability of amplification element 970 is ensured and so that the input impedance at frequency $f_2$ of the stabilized amplification element based on stabilization circuit 200 lets designers make it possible to design multiband matching circuit 990 to e.g. have a small size at frequency $f_2$. As for the design in this case, design items of a suitable parallel stabilization block 230 and parallel stabilization block 250 may be added to any one of the design candidates when the aforementioned operating frequency is $f_1$.

As in the case of Embodiment 1, stabilization circuit 200, makes it possible to design the input impedances of a stabilized amplification element in two different frequency ranges, while ensuring the stability of amplification element 970 across a wide range of frequencies. So, in the meaning that it is possible to design so that impedance matching can be obtained between the input impedance, set in each of several frequency bands (two in the variation of Embodiment 1), of a stabilized amplification element and the system impedance, the latitude in the design of the multiband matching circuit increases. The aforementioned input impedance is read as the output impedance of the stabilized amplification element, in the case where the stabilization circuit is arranged on the output side of the amplification element.

As for the constituent elements of the serial stabilization blocks and the parallel stabilization blocks, distributed-parameter lines, lumped-parameter elements, or a combination thereof may be utilized. According to design specifications for frequency and the like, a serial stabilization block may be omitted, depending on the design objective. In the example of the embodiment shown in FIG. 6, it is possible to choose not to provide serial stabilization block 210'.

In Embodiment 1 and the variation thereof, the stabilization circuit is connected to the input terminal of amplification element 970. However, a similarly designed stabilization circuit may be connected to the output terminal, or stabilization circuits may be connected to both the input terminal and the output terminal. Generally, the stabilization circuit connecting to the output terminal of amplification element 970 has a configuration which is symmetric to the configuration of the stabilization circuit connecting to the input terminal with respect to the amplification element 970.

In Embodiment 1 and the variation thereof, since switch part 150 is provided, an insertion loss occurs when the ON state of switch part 150 is chosen. However, since switch part 150 is connected in parallel with respect to the signal path, it is possible to reduce the influence by making a design so as to minimize the insertion loss in the design stage for frequency $f_2$.

Second Embodiment

Figure 7:
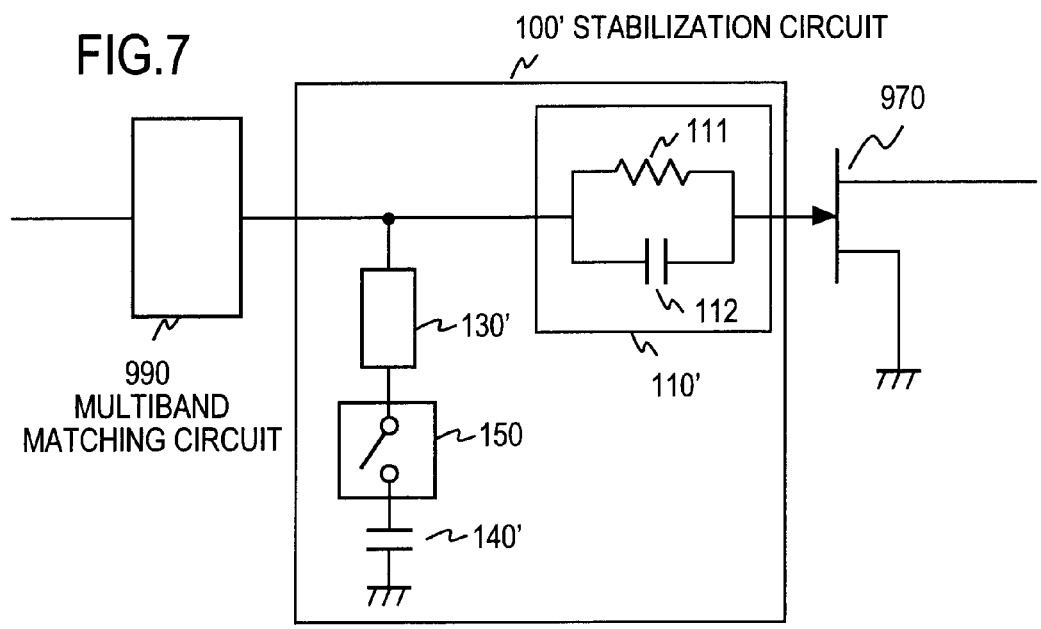
FIG. 7 is a circuit diagram showing an exemplification of the stabilization circuit in the first embodiment.

In Embodiment 2, the explanation about an exemplification of the stabilization circuit of Embodiment 1 and a multiband matching circuit using the same stabilization circuit will be given as follows. FIG. 7 shows a specific configuration example of the stabilization circuit of Embodiment 1. Stabilization circuit 100' has the same configuration as stabilization circuit 100 of Embodiment 1 (see FIG. 5) except that serial stabilization block 120 of FIG. 5 has been omitted. A serial stabilization block 110' corresponds to serial stabilization block 110, a transmission line 130' corresponds to parallel stabilization block 130, and a capacitor 140' corresponds to parallel stabilization block 140. Serial stabilization block 110' comprises a resistor 111 and a capacitor 112 connected in parallel.

Figure 8:
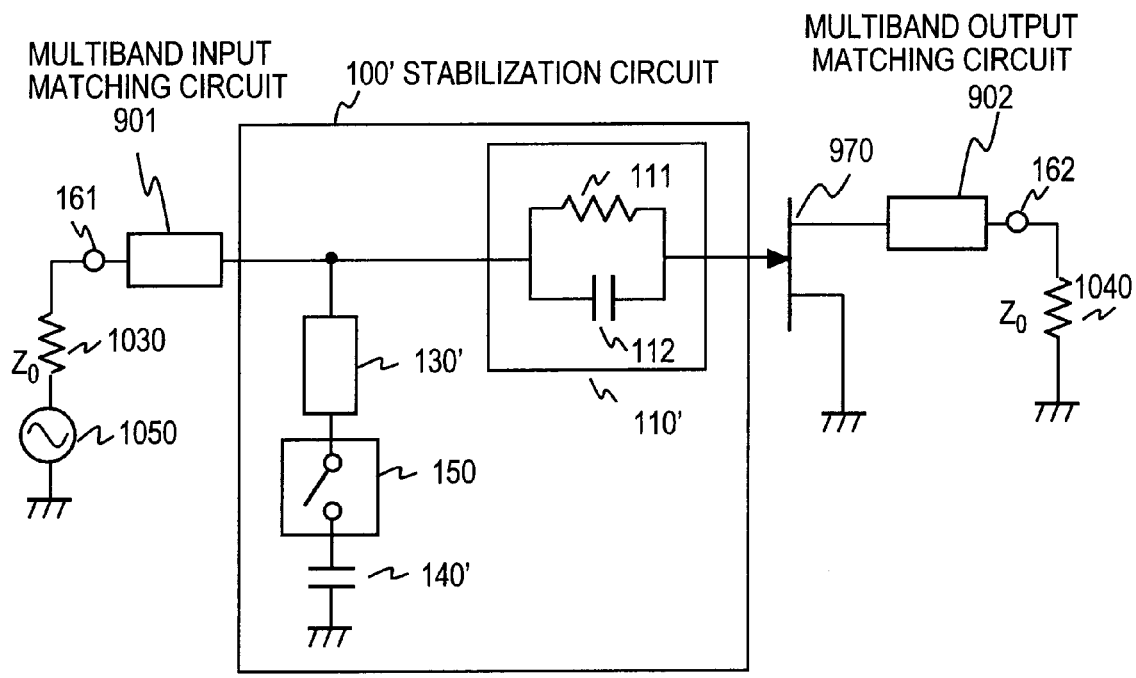
FIG. 8 is a circuit diagram showing an example of a multiband amplification circuit using an exemplification of a stabilization circuit in the first embodiment.

FIG. 8 shows a specific configuration example of a multiband amplification circuit using a stabilization circuit of the present invention. Between amplification element 970 and a port 161 on the side of signal source 1050, a stabilization circuit 100' and a multiband input matching circuit 901 are inserted in series. Also, between amplification element 970 and a port 162 on the output terminal, a multiband output matching circuit 902 is inserted in series. Numeral 1030 expresses the input impedance of signal source 1050 and numeral 1040 expresses the output load impedance. According to the method described in the aforementioned Reference 2 or the like, multiband input matching circuit 901 and multiband output matching circuit 902 can be designed so that impedance matching can be obtained in two different frequency bands. By configuring in this way, the multiband amplification circuit shown in FIG. 8 can operate while obtaining impedance matching in two different frequency bands.

Third Embodiment

Figure 9:
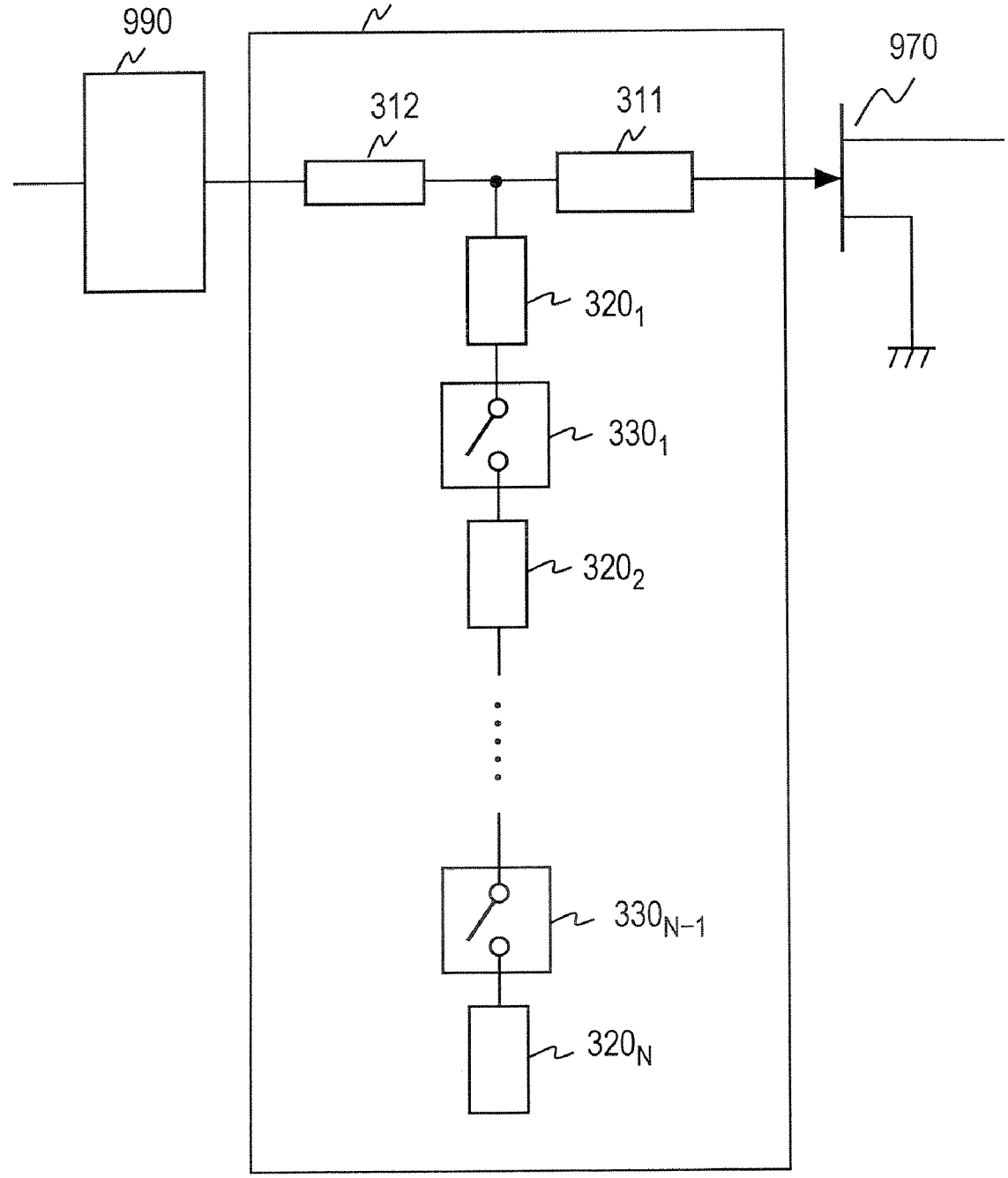
FIG. 9 is a circuit diagram showing a configuration example of a stabilization circuit which can handle N frequency bands.

In Embodiment 3, an explanation will be given of a stabilization circuit of the present invention which can handle three or more frequency bands. FIG. 9 shows a configuration example of a stabilization circuit which can handle N frequency bands. Stabilization circuit 300 comprises two serial stabilization blocks 311 and 312, N parallel stabilization blocks $320_1$, $320_2$, and $320_N$ and N−1 switch parts $330_1$, $330_2$, . . . , and $330_{N-1}$. Serial stabilization blocks 311 and 312 are connected in series with the amplification element. One terminal of parallel stabilization block $320_1$ is connected between serial stabilization block 311 and serial stabilization block 312. The other terminal of parallel stabilization block $320_1$ is connected to switch part $330_1$. One terminal of parallel stabilization block $320_n$ is connected to switch part $330_{n-1}$. The other terminal of parallel stabilization block $320_n$ is connected to switch part $330_{n-1}$. One terminal of parallel stabilization block $320_{N-1}$ is connected to switch part $330_{N-2}$. The other terminal of parallel stabilization block $320_{N-1}$ is connected to parallel stabilization block $320_N$ via switch part $330_{N-1}$. Here, n is an integer in the range 2, 3, . . . , N−2.

When handling the ith frequency $f_i$, stabilization circuit 300 has switch parts $330_1$, $330_2$, . . . , and $330_{i-1}$ put in the ON state and switch part $330_i$ put in the OFF state. However, in the case of i=1, switch part $330_1$, is set in the OFF state. The setting of the design values of each constituent element is performed in the same way as in Embodiment 1, for each frequency.

Each states (ON state or OFF state) of switch parts $330_{i+1}$, $330_{i+2}$, . . . , and $330_{N-1}$ beyond switch part $330_i$ in the OFF state, is arbitrary. Further, by adjusting the impedance of the side of parallel stabilization blocks $320_{i+1}$, $320_{i+2}$, . . . , and $320_N$ seen from switch part $330_i$ to be close to infinity, it is possible to prevent degradation of the characteristics of the circuit as a whole, even if the isolation characteristics of the switch parts are poor in the case of frequency $f_i$.

There are also cases where each serial stabilization block or each parallel stabilization block can be omitted in response to design objectives and the like. In the example of the embodiment shown in FIG. 9, it is possible to take an example where either of serial stabilization blocks 311 and 312 is not provided, and it is also possible to suitably set the number of parallel stabilization blocks in response to design objectives and the like.

The First Variation of the Third Embodiment

Figure 10:
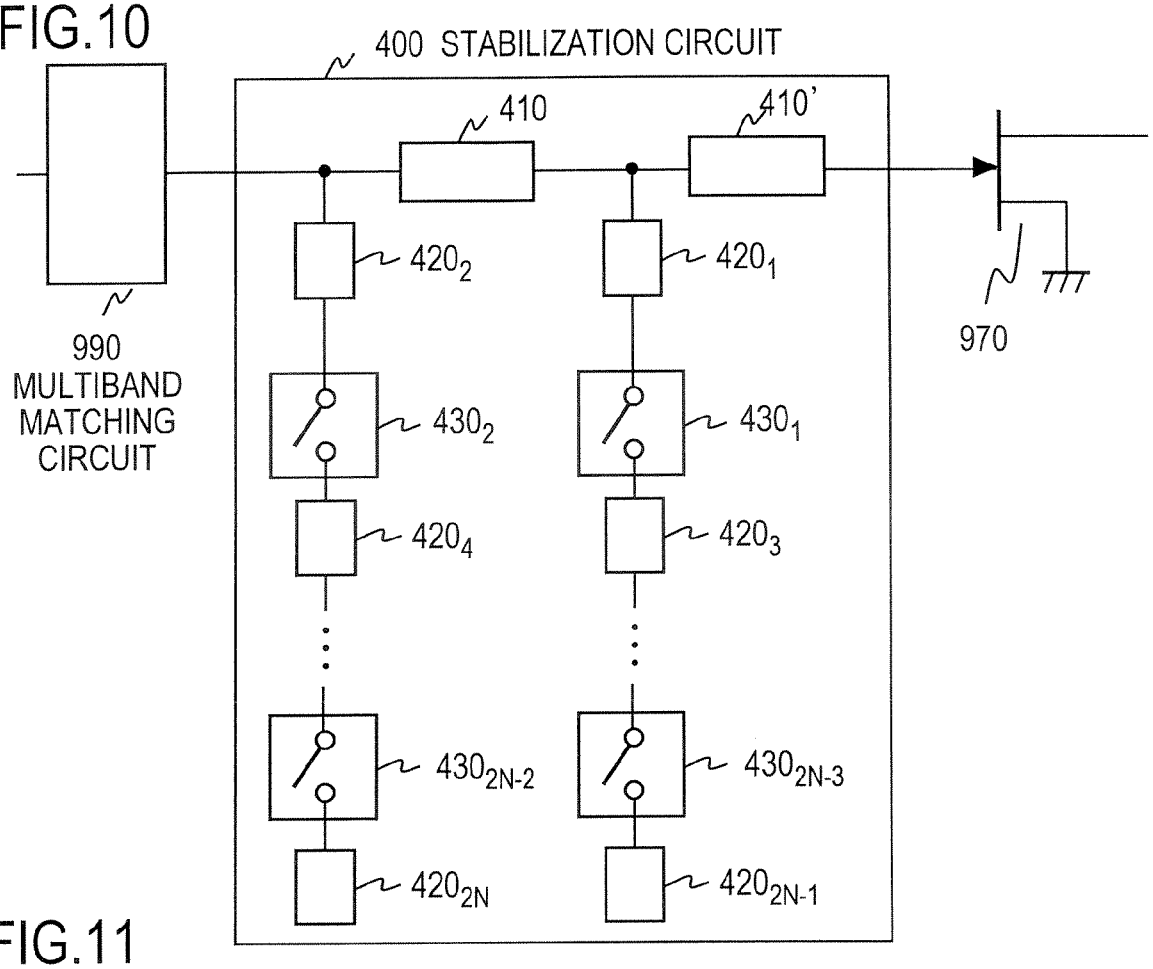
FIG. 10 is a circuit diagram showing a variation of the configuration of a stabilization circuit which can handle N frequency bands.

FIG. 10 represents a variation of the configuration of a stabilization circuit of the present invention capable of handling N frequency bands. Stabilization circuit 400 comprises two serial stabilization blocks 410 and 410', 2N parallel stabilization blocks $420_1$, $420_2$, . . . , and $420_{2N}$, and 2N−2 switch parts $430_1$, $430_2$, . . . , and $430_{2N-2}$. Serial stabilization blocks 410 and 410'are connected in series with amplification element 970, with respect to a signal to be amplified. One terminal of parallel stabilization block $420_1$ is connected to one end of serial stabilization block 410. The other terminal of parallel stabilization block $420_1$ is connected to switch part $430_1$. One end of parallel stabilization block $420_2$ is connected to the other end (that side to which parallel stabilization block $420_1$ is not connected) of serial stabilization block 410. The other terminal of parallel stabilization block $420_2$ is connected to switch part $430_2$. One terminal of parallel stabilization block $420_n$ is connected to switch part $430_{n-2}$. The other terminal of parallel stabilization block $420_n$ is connected to switch part $430_n$. Here, n is an integer in the range 3, 4, ..., 2N-4. One terminal of parallel stabilization block $420_{2N-3}$ is connected to switch part $430_{2N-5}$. The other terminal of parallel stabilization block $420_{2N-3}$ is connected to parallel stabilization block $420_{2N-1}$ via switch part $430_{2N-3}$. One terminal of parallel stabilization block $420_{2N-2}$ is connected to switch part $430_{2N-4}$. The other terminal of parallel stabilization block $420_{2N-2}$ is connected to parallel stabilization block $420_{2N}$ via switch part $430_{2N-2}$.

Stabilization circuit 400, in the case of handling the ith frequency $f_i$, has switch parts $430_1$, $430_2$, ..., and $430_{2i-2}$ put in the ON state and switch part $430_{2i-1}$ and switch part $430_{2i}$ put in the OFF state. However, in the case of i=1, switch part $430_1$ and switch part $430_2$ are put in the OFF state. The settings of the design values of each constituent component are carried out in the same way as in the variation of Embodiment 1 for each frequency.

Also, the each state (ON state or OFF state) of switch parts $430_{2i+1}$, $430_{2i+2}$, ..., and $430_{2N-2}$ is arbitrary. Further, by adjusting the impedance of the side of parallel stabilization blocks $420_{2i+1}$, $420_{2i+3}$, ..., and $420_{2N-1}$ seen from switch part $430_{2i-1}$ and the impedance of the side of parallel stabilization blocks $420_{2i+2}$, $420_{2i+4}$, ..., $420_{2N}$ seen from switch part $430_{2i}$ to be close to infinity, it is possible to prevent a degradation in the characteristics of the circuit as a whole, even if the isolation characteristics of the switch parts are poor in the case of frequency $f_1$.

There are cases where each serial stabilization block or each parallel stabilization block may be omitted depending on the design objectives. In the example of the embodiment shown in FIG. 10, it is possible to take an example where serial stabilization block 410'is not provided. It is also possible to set suitably the number of parallel stabilization blocks in response to design objectives and the like.

The Second Variation of the Third Embodiment

Figure 11:
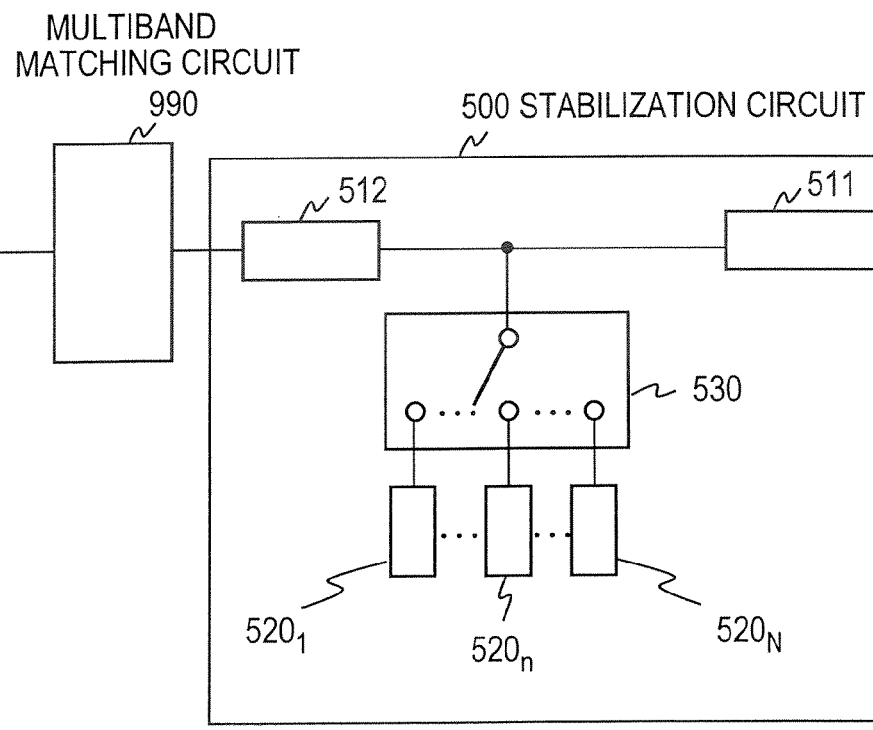
FIG. 11 is a circuit diagram showing another variation of the configuration of a stabilization circuit which can handle N frequency bands.

FIG. 11 represents another variation of the configuration of a stabilization circuit capable of handling N frequency bands. A stabilization circuit 500 comprises two serial stabilization blocks 511 and 512, N parallel stabilization blocks $520_1$, to $520_N$, and a single-pole N-throw switch part 530 performing 1-to-N switching. The single-pole N-throw switch part 530 is provided with a master side having only one terminal and a switching side having N terminals, and switches the terminal on that switching side which is connected to the terminal on the master side. Serial stabilization block 511 and serial stabilization block 512 are connected, with respect to a signal to be amplified, to amplification element 970. The terminal on the master side of switch part 530 is connected between serial stabilization block 511 and serial stabilization block 512. The N terminals on the switching side of switch part 530 are respectively connected to the N parallel stabilization blocks $520_1$, $520_2$, ..., and $520_N$.

In the case of handling the ith frequency $f_i$, in the stabilization circuit 500, the terminal on the master side of switch part 530 connects to the switching side terminal allocated to the ith frequency $f_i$. The settings of the design values of each constituent element are carried out in the same way as in Embodiment 1 regarding each frequency. There are cases where each of the serial stabilization blocks or each of the parallel stabilization blocks can be omitted in accordance with the design objectives. In the example of the embodiment shown in FIG. 11, it is possible to take an example where either one of serial stabilization blocks 511 and 512 is not provided, or neither is provided, and it is also possible to suitably set the number of parallel stabilization blocks, in accordance with the design objectives and the like.

In Embodiment 3, stabilization circuits 300, 400, and 500 are respectively connected to the input terminal side of amplification element 970. But each may also be connected to the output terminal side of amplification element 970. Alternatively, each may be connected to both the input terminal side and the output terminal side of amplification element 970.

A Specific Example Based on Circuit Simulation

Figure 12:
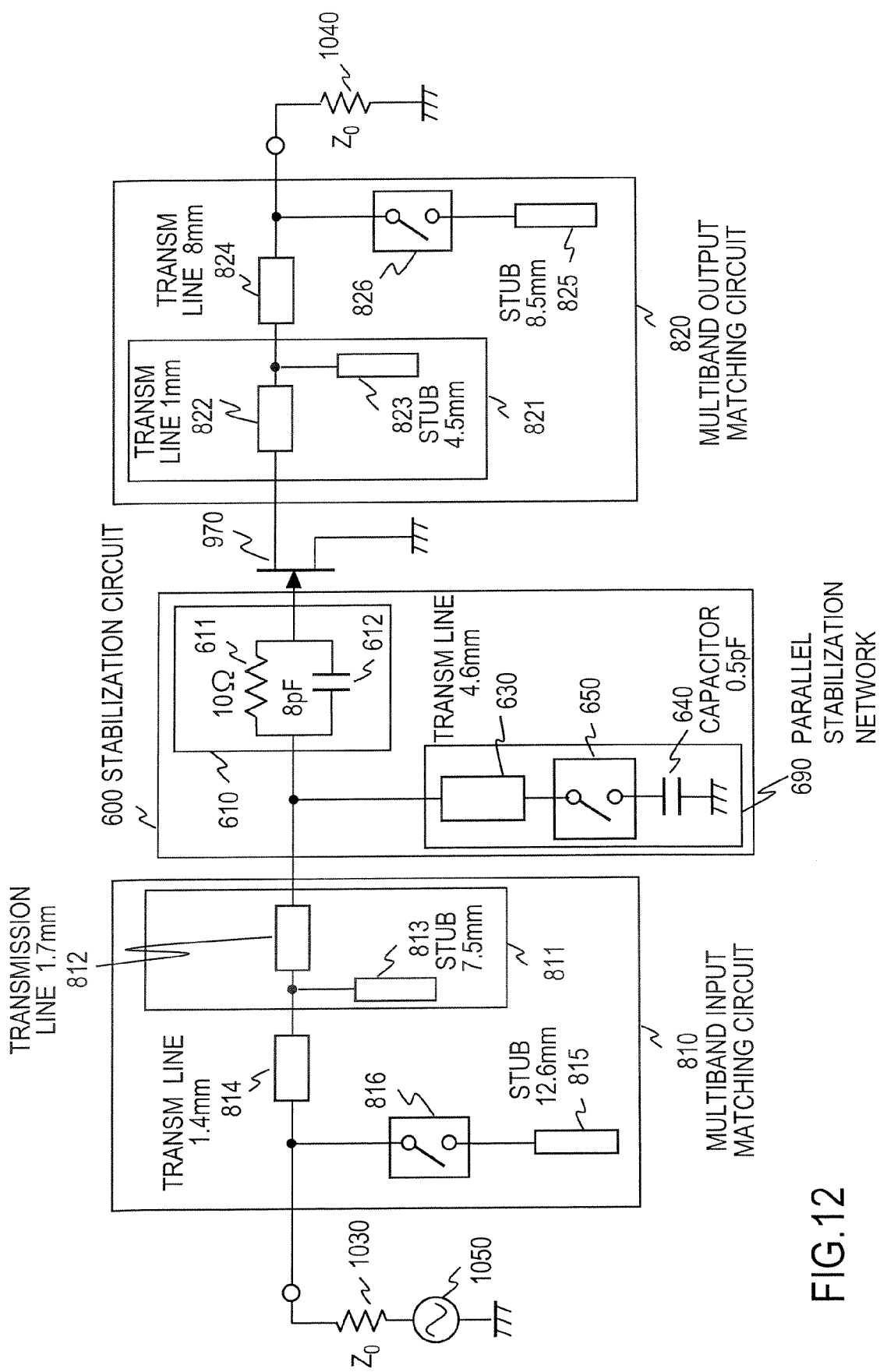
FIG. 12 is a circuit diagram showing an exemplification of an amplification circuit using a stabilization circuit in the first embodiment.

FIG. 12 represents a specific example of a multiband amplification circuit using the stabilization circuit of Embodiment 1 of the present invention. A simulation was carried out to design this multiband amplification circuit as a multiband amplification circuit capable of amplification at two frequencies ($f_1$=5 GHz and $f_2$=2 GHz). This multiband amplification circuit was taken to comprises amplification element 970, a stabilization circuit 600, and a multiband input matching circuit 810 connected to the input terminal of amplification element 970, and a multiband output matching circuit 820 connected to the output terminal of amplification element 970. For amplification element 970, a GaAs FET that can be procured in the market (having frequency characteristics like those of FIG. 1) and an alumina substrate with a dielectric constant of 9.5 and a substrate thickness of 0.635 mm were selected. Here, the characteristic impedances $Z_0$ of the transmission lines were in all cases taken to be 50Ω. As for stabilization circuit 600, the configuration example shown in FIG. 7 was used. First, in order to be able to design multiband input matching circuit 810 corresponding to frequency $f_1$ (5 GHz band) to have a small size, stabilization circuit 600 was designed taking switch part 650 to be in the OFF state. As a result, serial stabilization block 610, in order to ensure the stabilization of amplification element 970, was taken to have a configuration with a parallel connection of a resistor 611 of 10Ω and an capacitor 612 of 8 pF. Also, a transmission line 630 of 4.6 mm was taken for the first parallel stabilization block. Next, assuming a design at frequency $f_1$, in order to be able to design a multiband input matching circuit 810 to have a small size with respect to frequency $f_2$ (2 GHz band), stabilization circuit 600 was designed taking switch part 650 to be in the ON state. As a result, the second parallel stabilization block was taken to be a capacitor of 0.5 pF.

Taking into account the respective input and output impedances of stabilization circuit 600 of a mode of the present invention and amplification element 970, multiband input matching circuit 810 and multiband output matching circuit 820 were designed. In other words, multiband input matching circuit 810 was designed to be able to match impedances between the input impedance of the stabilized amplification element based on stabilization circuit 600 and the input impedance of signal source 1050. Also, multiband output matching circuit 820 was designed to be able to match impedances between the output impedance of amplification element 970 and the load impedance.

As a result of this, multiband input matching circuit 810 was composed of a main matching block 811, a transmission line 814 of 1.4 mm, a stub 815 of 12.6 mm, and a switch part 816. Main matching block 811 was composed of a transmission line 812 of 1.7 mm and a stub 813 of 7.5 mm. Multiband output matching circuit 820 was composed of a main matching block 821, an transmission line 824 of 8 mm, an stub 825 of 8.5 mm, and a switch part 826. Main matching block 821 was composed of a transmission line 822 of 1 mm and a stub 823 of 4.5 mm. In this simulation experimental example, the design was carried out in conformity with the multiband matching circuit shown in FIG. 2. However, the stabilization circuit of the present invention is not only a circuit which can coexist only with the multiband matching circuit shown in FIG. 2, but also a circuit which is capable of coexisting with various matching circuits without any limit whatsoever. So to state it further, according to a stabilization circuit of the present invention, the impedance of the stabilization circuit can be suitably set so that various matching circuits can e.g. be designed to have a small size.

The multiband amplification circuit shown in FIG. 12 behaves as an amplification circuit operating in the 5 GHz band (5 GHz band mode) in the case where switch parts 650, 816, and 826 are in the OFF state. And it behaves as an amplification circuit operating in the 2 GHz band (2 GHz band mode) in the case where the switch parts 650, 816, and 826 are in the ON state.

Figure 13:
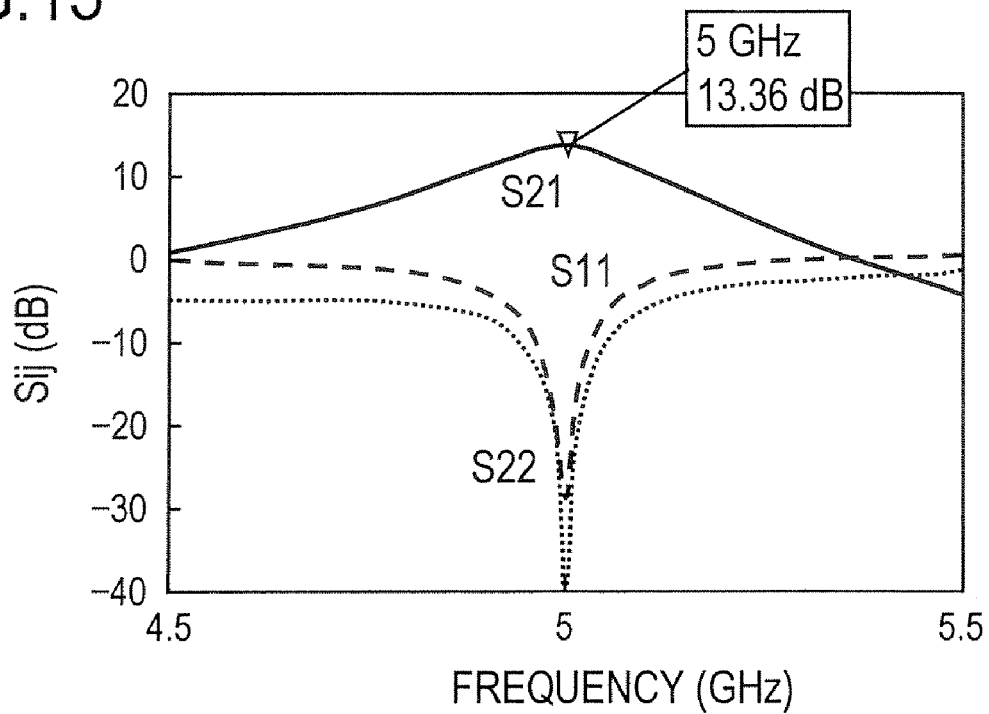
FIG. 13 is a diagram showing the simulation results of the frequency characteristics, in the vicinity of the operating frequency in the 5 GHz band, of a multiband amplification circuit using a stabilization circuit in the first embodiment.
Figure 14:
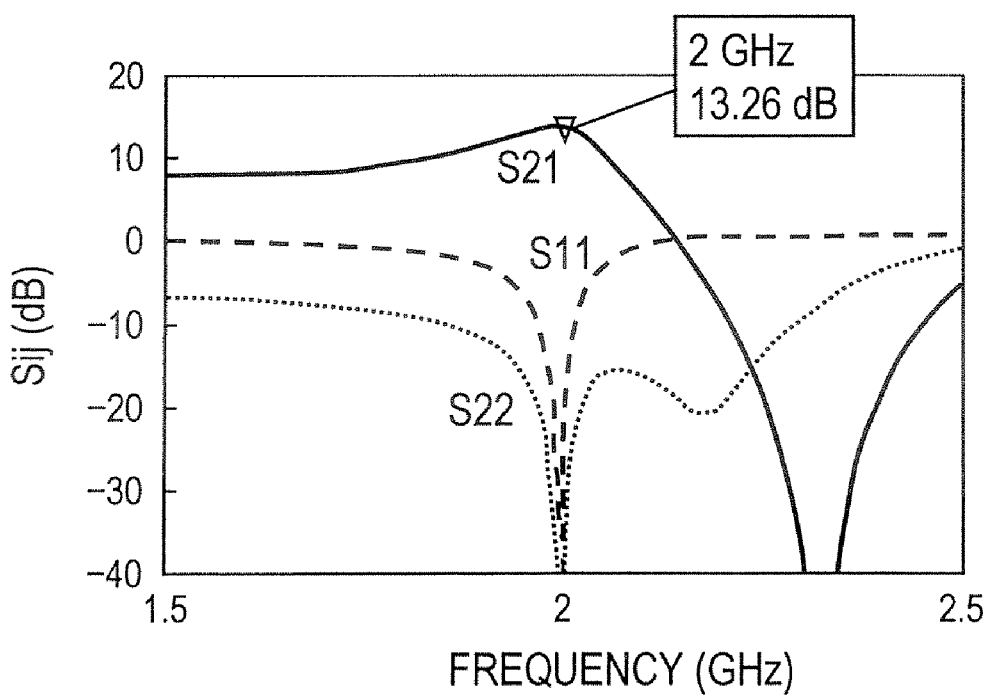
FIG. 14 is a diagram showing the simulation results of the frequency characteristics, in the vicinity of the operating frequency in the 2 GHz band, of a multiband amplification circuit using a stabilization circuit in the first embodiment.

The simulation results of the frequency characteristics in the vicinity of the operating frequency in the 5 GHz mode are shown in FIG. 13 and the simulation results of the frequency characteristics in the vicinity of the operating frequency in the 2 GHz mode are shown in FIG. 14. S11 is an S-parameter representing the reflection coefficient on the input side, S22 is an S-parameter representing the reflection coefficient on the output side, and S21 is an S-parameter representing the transmission coefficient. It is seen that impedance matching is obtained at the respective design frequencies and that maximum gain can be obtained.

A Comparative Example Based on the Circuit Simulation

Figure 15:
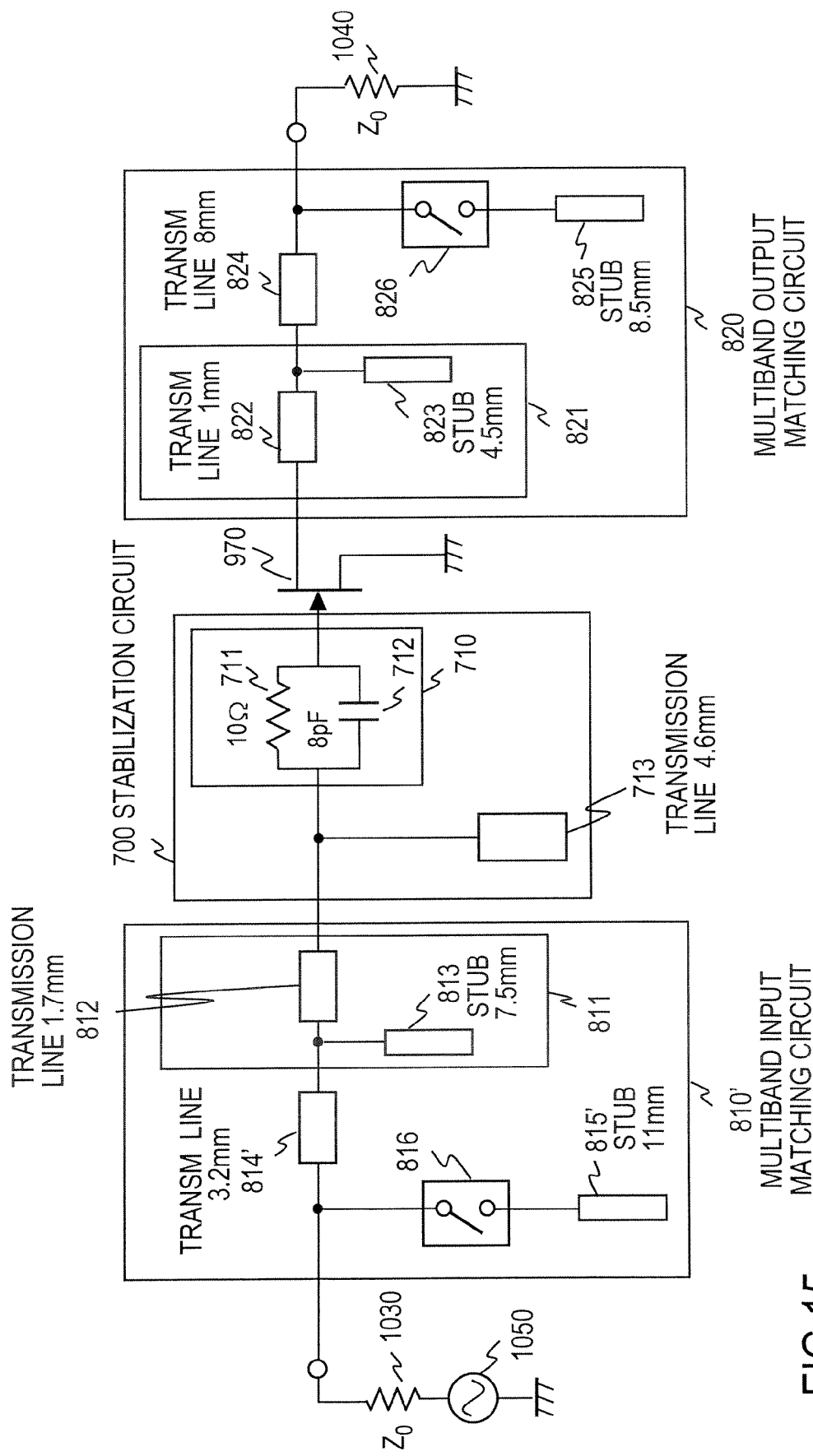
FIG. 15 is a circuit diagram showing an exemplification of a multiband amplification circuit using a conventional stabilization circuit.

In FIG. 15, there is shown a specific example of a multi-band amplification circuit using a stabilization circuit of the prior-art example. This multiband amplification circuit is a circuit capable of amplifying at two frequencies ($f_1$=5 GHz and $f_2$=2 GHz). For amplification element 970, the same FET and alumina substrate as in FIG. 12 were selected. Also, the characteristic impedances $Z_0$ of the transmission lines were all taken to be 50Ω. Stabilization circuit 700 is a circuit shown in FIG. 12 for which it is possible to design a multiband matching circuit to have a small size only in the 5 GHz band. In other words, as for the conventional stabilization circuit 700, assuming that the multiband matching circuit has been designed to have a small size in the 5 GHz band, there is no guarantee that the multiband matching circuit can be designed to have a small size in the 2 GHz band as well. As a result of this, serial stabilization block 710 was taken to have a parallel connection of a resistor 711 of 10Ω and a capacitor 712 of 8 pF. Also, the parallel stabilization block was taken to be a transmission line 713 of 4.6 mm. By means of stabilization circuit 700, the amplification element 970 is stabilized not only at 5 GHz frequency but also at 2 GHz.

A multiband input matching circuit 810' was designed taking into account the input impedance of the stabilized amplification element based on stabilization circuit 700. As a result of this, multiband input matching circuit 810' was composed of main matching block 811, a transmission line 814' of 3.2 mm, a stub 815' of 11 mm, and a switch part 816.

The multiband amplification circuit shown in FIG. 15 behaves as an amplification circuit operating in the 5 GHz band (5 GHz band mode) in the case where switch part 816 and switch part 826 are in the OFF state. And it behaves as an amplification circuit operating in the 2 GHz band (2 GHz band mode) in the case where both switch parts are in the ON state.

Figure 16:
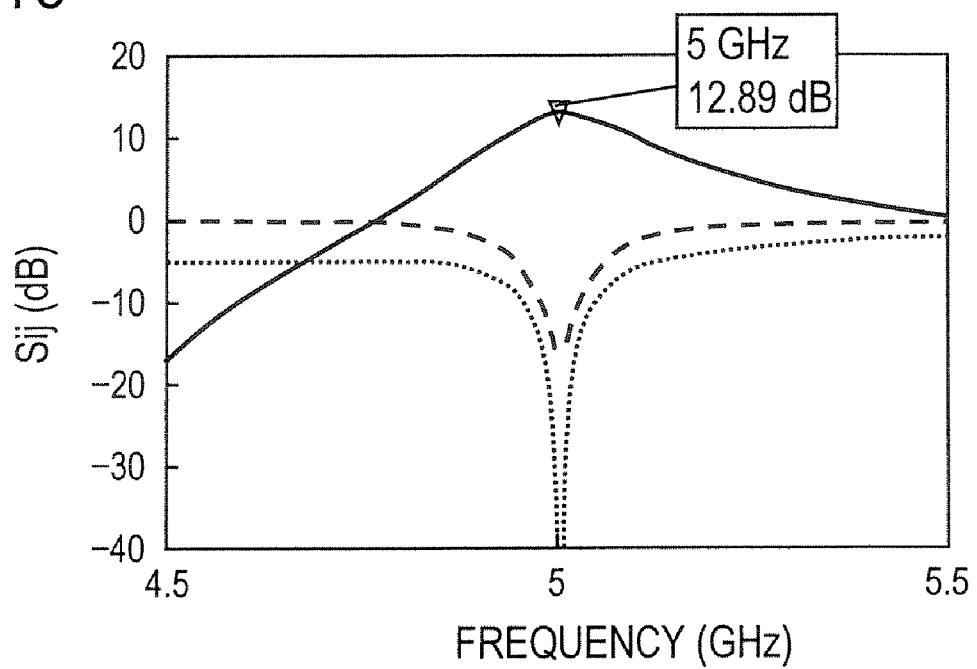
FIG. 16 is a diagram showing the simulation results of the frequency characteristics, in the vicinity of the operating frequency in the 5 GHz band, of a multiband amplification circuit using a conventional stabilization circuit.
Figure 17:
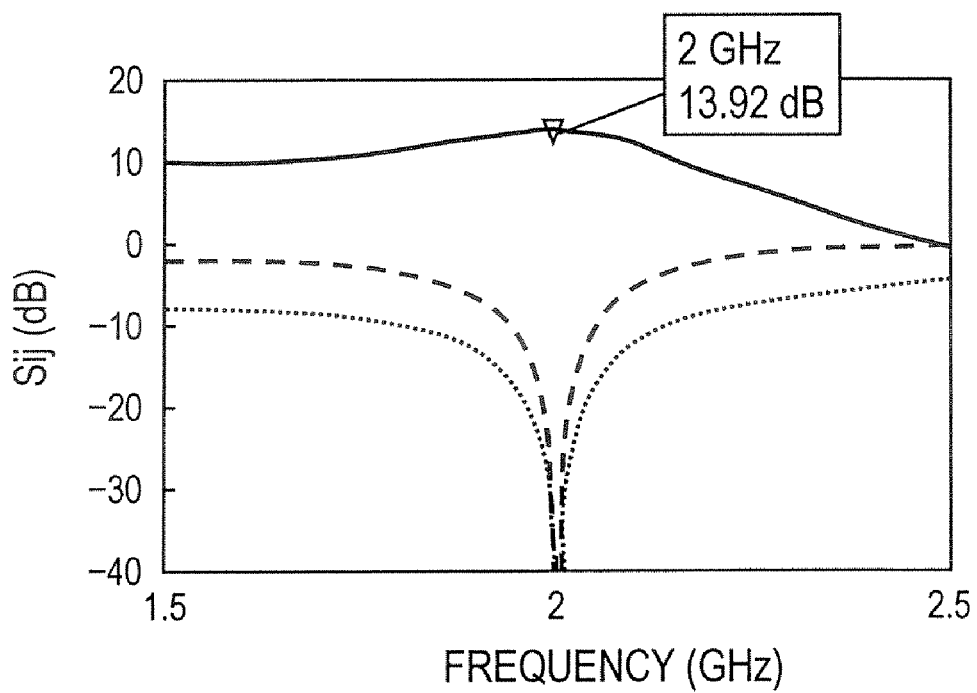
FIG. 17 is a diagram showing the simulation results of the frequency characteristics, in the vicinity of the operating frequency in the 2 GHz band, of a multiband amplification circuit using a conventional stabilization circuit.

The simulation results of the frequency characteristics in the vicinity of the operating frequencies in the 5 GHz mode are shown in FIG. 16 and the simulation results of the frequency characteristics in the vicinity of the operating frequencies in the 2 GHz mode are shown in FIG. 17. S11 is an S-parameter representing the reflection coefficient on the input side, S22 is an S-parameter representing the reflection coefficient on the output side, and S21 is an S-parameter representing the transmission coefficient. The results shown in FIG. 16 and FIG. 17 are nearly the same as those shown in FIG. 13 and FIG. 14. However, the length of transmission line 814' of the multiband input matching circuit shown in FIG. 15 is 3.2 mm, whereas the length of transmission line 814 of the multiband amplification circuit shown in FIG. 12 is 1.4 mm. In other words, in case an attempt is made to design an amplification circuit with the same performance, it is possible to choose the line length of the transmission line to be about ½ of that in the case of using the conventional stabilization circuit, if the stabilization circuit of present invention is used. In other words, by a stabilization circuit of the present invention, it is possible to reduce the size of the whole circuit and to reduce the installation area.

Further, the length of stub 815 of multiband input matching circuit 810 shown in FIG. 12 is 12.6 mm, whereas the length of stub 815' of multiband input matching circuit 810' shown in FIG. 15 is 11 mm. Consequently, in the case of using the stabilization circuit of the present invention, the length of stub was designed to be longer in comparison with using the conventional stabilization circuit. However, it is possible to replace stubs 815 and 815' by lumped-parameter elements such as coils and capacitors for which a prescribed reactance value can be obtained in a single frequency band, so they can readily be reduced in size. Moreover, since it is necessary for transmission lines 814 and 814' to maintain the impedance across many frequencies, replacement with lumped-parameter elements is difficult. Consequently, according to the present invention, the fact that it is possible to shorten transmission line 814' down to the length of transmission line 814 provides a major effect from the aspect of miniaturizing of the circuit.

Also, Let's assume a multiband amplification circuit using a stabilization circuit 600 in which switch part 650 shown in FIG. 12 is fixed to be in the ON state (optimal at 2 GHz). When this multiband amplification circuit is operated at 2 GHz band, switch part 816 inside the multiband matching circuit is taken to be in the ON state. By choosing switch part 650 of the stabilization circuit to be in the ON state, the capacity of the capacitor 640 is set so that transmission line 814 becomes shorter than transmission line 814' shown in FIG. 15. In this way, it has been difficult to attain stabilization of the amplification element and a reduction in size of the whole circuit for all the frequencies of the multiple bands to be amplified without modifying the fixed number of circuits. However, according to the present invention, a configuration in which the reactance of the parallel stabilization network 690 inside the stabilization circuit is modified by the opening and closing of switch part 650 shown in FIG. 12 provides a reduction in size of the whole amplification circuit.

If the stabilization circuit adaptable for multiband operations, of the present invention, is used with the output matching circuit of an amplifier, it is possible to obtain the same effect for the output matching circuit as well. Also, the configuration method of the multiband matching circuit is not one that is limited to the aforementioned embodiments and simulation examples. E.g., even in the case of configuring the multiband matching circuit by means of lumped-parameter elements, it is possible to reduce the inductances of the coils and the capacitances of the capacitors. Even in the case of using lumped-parameter elements, the smaller the design value of each element, the easier it becomes to integrate the whole circuit and to aim for a reduction in the size of the whole circuit.

What is claimed is:

1. A multiband stabilization circuit for an amplification element which is connected to at least either one of an input terminal and an output terminal of the amplification element, the stabilization circuit comprising:
   a serial stabilization block connected in series to the amplification element;
   one or more switch parts; and
   a plurality of parallel stabilization blocks connected in parallel to a series circuit of the serial stabilization block and the amplification element via the one or more switch parts,
   wherein the amplification element amplifies each signal of at least two different frequency bands;
   each of said one or more switch parts is rendered in an ON or OFF state depending on each of the frequency bands; and
   the serial stabilization block and the parallel stabilization blocks connected to the series circuit via the one or more switch parts in the ON state ensure a stability of the amplification element at each of the frequency bands.

2. The multiband stabilization circuit according to claim 1, wherein:
   a number of the parallel stabilization blocks is two, one referred to as "the first parallel stabilization block" and the other referred to as "the second parallel stabilization block";
   a number of the switch parts is one;
   one terminal of the first parallel stabilization block is connected to one terminal of the serial stabilization block; and
   the other terminal of first parallel stabilization block is connected to the second parallel stabilization block via the switch part.

3. The multiband stabilization circuit according to claim 1, further comprising:
   a second serial stabilization block, wherein a number of the parallel stabilization blocks is two, one referred to as "the first parallel stabilization block" and the other referred to as "the second parallel stabilization block";
   a number of the switch parts is one;
   one terminal of the first parallel stabilization block is connected between the serial stabilization block and the second serial stabilization block; and
   the other terminal of the first parallel stabilization block is connected to the second parallel stabilization block via the switch part.

4. The multiband stabilization circuit according to claim 1, wherein:
   a number of the parallel stabilization blocks is four, hereinafter referred to as "the first parallel stabilization block", "the second parallel stabilization block", "the third parallel stabilization block", and "the fourth parallel stabilization block", respectively;
   a number of the switch part is two, one referred to as "the first switch part" and the other referred to as "the second switch part";
   one terminal of the first parallel stabilization block is connected to one terminal of the serial stabilization block;
   the other terminal of the first parallel stabilization block is connected to the second parallel stabilization block via the first switch part;
   one terminal of the third parallel stabilization block is connected to the other terminal of the serial stabilization block which the first parallel stabilization part is not connected to; and
   the other terminal of the third parallel stabilization block is connected to the fourth parallel stabilization block via the second switch part.

5. The multiband stabilization circuit according to claim 1, wherein:
   a number of the parallel stabilization blocks is N, hereinafter referred to as "the first parallel stabilization block", "the second parallel stabilization block", . . . , and "the Nth parallel stabilization block", respectively, wherein N denotes a predetermined integer greater than or equal to 3 and n denotes each integer greater than or equal to 2 and less than or equal to N-1; a number of the switch parts is N-1, hereinafter referred to as "the first switch part", "the second switch part", . . ., and "the (N-1)th switch part", respectively;
   one terminal of the first parallel stabilization block is connected to one terminal of the serial stabilization block;
   the other terminal of the first parallel stabilization block is connected to the first switch part;
   one terminal of the nth parallel stabilization block is connected to the (N-1)th switch part;
   the other terminal of the nth parallel stabilization block is connected to the nth switch part; and
   the Nth parallel stabilization block is connected to the (N-1)th switch part.

6. The multiband stabilization circuit according to claim 1, wherein:
   a number of the parallel stabilization blocks is 2N, hereinafter referred to as "the first parallel stabilization block", "the second parallel stabilization block", . . . , and "the (2N)th parallel stabilization block", respectively, wherein N denotes a predetermined integer greater than or equal to 3 and n denotes each integer greater than or equal to 2 and less than or equal to 2N-2; a number of the switch parts is 2N-2, hereinafter referred to as "the first switch part", "the second switch part", . . . , and "the (2N-2)th switch part", respectively;
   one terminal of the first parallel stabilization block is connected to one terminal of the serial stabilization block;
   the other terminal of the first parallel stabilization block is connected to the first switch part;
   one terminal of the second parallel stabilization block is connected to the other terminal of the serial stabilization block the first parallel stabilization part is not connected to;
   the other terminal of the second parallel stabilization block is connected to the second switch part;
   one terminal of the nth parallel stabilization block is connected to the (N-2)th switch part;
   the other terminal of the nth parallel stabilization block is connected to the nth switch part;
   the other terminal of the (2N-3)th parallel stabilization block is connected to the (2N-3)th switch part; and the other terminal of the (2N-2)th parallel stabilization block is connected to the (2N-2)th switch part.

7. The multiband stabilization circuit according to claim 1, wherein:
a number of the parallel stabilization blocks is said N. wherein N denotes a predetermined integer greater than or equal to 2;
a number of the switch parts is one;
the switch part carries out 1-to-N switching;
the switch part is connected to one terminal of the serial stabilization block; and
the switch part selects and connects one parallel stabilization block from among the N parallel stabilization blocks.

8. A multiband amplification circuit handling two or more frequency bands, comprising:
an amplification element configured to amplify each signal of the frequency band;
a multiband stabilization circuit which comprises a serial stabilization block connected in series to an input or output terminal of the amplification element, one or more switch parts, and a plurality of parallel stabilization blocks connected in parallel to a series circuit of the serial stabilization block and the amplification element via the one or more switch part. wherein each of said one or more switch parts is rendered in an ON or OFF state depending on each of the frequency bands, and the serial stabilization block and the parallel stabilization blocks connected to the series circuit via the one or more switch parts in the ON state ensure a stability of the amplification element at each of the frequency bands; and
a multiband matching circuit configured to impedance match in each of the frequency bands and being connected to one terminal of the multiband stabilization circuit that is opposite to the terminal which the amplification element is connected to.

9. The multiband stabilization circuit according to claim 1, wherein:
a series circuit of the parallel stabilization blocks, where the adjacent parallel stabilization blocks are connected by one said switch part, is connected to the series circuit of the serial stabilization block and the amplification element without using the one or more switch parts.

10. The multiband stabilization circuit according to claim 1, wherein: the multiband stabilization circuit is connected in series between the amplification element and a multiband matching circuit configured to impedance match at each of two or more frequency bands.

* * * * *